United States Patent [19]

Tawada et al.

[11] Patent Number: 4,631,351
[45] Date of Patent: Dec. 23, 1986

[54] INTEGRATED SOLAR CELL

[75] Inventors: Yoshihisa Tawada; Kazunori Tsuge, both of Kobe, Japan

[73] Assignee: Kanegafuchi Kagaku Kogyo Kabushiki Kaisha, Osaka, Japan

[21] Appl. No.: 703,975

[22] Filed: Feb. 21, 1985

[30] Foreign Application Priority Data

Feb. 29, 1984 [JP] Japan .................................. 59-39078

[51] Int. Cl.$^4$ ............................................. H01L 27/14
[52] U.S. Cl. .................................. 136/244; 136/258; 357/30
[58] Field of Search ...................... 136/244, 258 AM; 357/30

[56] References Cited

U.S. PATENT DOCUMENTS 4,315,096 2/1982 Tyan et al. ........................... 136/244

OTHER PUBLICATIONS

H. Sakai et al., *Proceedings of SPIE*, vol. 407, pp. 26–32, (Apr. 1983).
A. H. Firester, *Proceedings of SPIE*, vol. 407, pp. 37–41, (Apr. 1983).

Primary Examiner—Aaron Weisstuch
Attorney, Agent, or Firm—Armstrong, Nikaido, Marmelstein & Kubovcik

[57] ABSTRACT

An integrated solar cell of cut-off construction, comprising a transparent support, a transparent electrode provided on said transparent support in the form of a plurality of elongated parallel bands, a semiconductor layer disposed on said transparent electrode in the form of a plurality of elongated parallel bands so that each of said semiconductor bands does not cover one of long sides of the corresponding transparent electrode band but extends beyond the other long side over said transparent support or the adjacent transparent electrode, and a back side electrode layer disposed on said semiconductor layer in the form of a plurality of elongated parallel bands so that each of said back side electrode bands does not cover one of the long sides of the corresponding semiconductor band but extends beyond the other long side of said semiconductor band onto the adjacent transparent electrode band or the adjacent semiconductor band; the spaces therebetween being particularly defined. The output per unit area of the solar cell can be much increased.

3 Claims, 4 Drawing Figures

INTEGRATED SOLAR CELL

BACKGROUND OF THE INVENTION

The present invention relates to an integrated solar cell of cut-off construction.

In order to obtain a high-output solar cell, an integrated construction has heretofore been employed. A conventional integrated solar cell is generally fabricated by forming a pattern of independent transparent electrodes on a single transparent support, superimposing semi-conductor elements and back side electrodes on the pattern of transparent electrodes and intercontacting those solar cell elements in an integrated manner.

In such an integrated solar cell, since the solar cell elements must be formed independently of each other, the effective area of the elements accounts for only about 60% of the total surface area of the transparent support, with the result that the output of the whole solar cell per unit area is limited. In order to obtain a high output with such an integrated solar cell construction, it it necessary to increase the effective surface area of cell elements. However, since an attempt to increase the surface area inevitably results in an increased overall size of the device, the product cell is limited in its application and is also expensive. Moreover, since different patterns must be used for various solar cell output demands, the production process is complicated.

In view of the foregoing background, the present inventors conducted an intensive research to develop a solar cell which would have an increased ratio of the effective area of its cell elements to the surface area of the transparent support and a consequently increased solar cell output per unit area, and to fabricate solar cells suited for different output demands by using the same pattern of integration.

SUMMARY OF THE INVENTION

The present invention relates to an integrated solar cell of cut-off construction, comprising a transparent support, a transparent electrode provided on the transparent support in the form of a plurality of elongated parallel bands, a semiconductor layer disposed in the transparent electrode in the form of a plurality of elongated parallel bands so that each of the semiconductor bands does not cover one of the long sides of the corresponding transparent electrode band but extends beyond the other long side over the transparent support or the adjacent transparent electrode, and a back side electrode disposed in the semiconductor layer in the form of a plurality of elongated parallel bands so that each of the back side electrode bands does not cover one of the long sides of the corresponding semiconductor band, which side corresponds to the uncovered side of the transparent electrode band, but extends beyond the other long side of the semiconductor band onto the adjacent transparent electrode band or the adjacent semiconductor band; wherein the relationships between the positions of the transparent electrode, the semiconductor layer and the back side electrode are as follows:

$a \geq 10b$, $a \geq 10c$ and $a \geq 10d$ in which a is the space between the covered long side of the transparent electrode band and the opposite long side of the back side electrode band disposed through the semiconductor layer on the transparent electrode, b is the space between the covered long side of the transparent electrode band and the other long side of the adjacent transparent electrode band, c is the space between the covered long side of the back side electrode band on the above covered side and the other long side of the adjacent back side electrode band, and d is the space between the long side of the back side electrode band on the above covered side and the other long side of the adjacent back side electrode band; the solar cell being obtained by cutting the above construction in the widthwise direction of the transparent electrode bands with an interval B so as to satisfy the relationship $B \leq A \leq 100B$, wherein A is the overall length of the integrated solar cell.

DETAILED DESCRIPTION

The transparent support employed in the present invention may be any transparent material formed in a thickness of about 0.1 to 50 mm and with a width of about 100 to 1000 mm from various raw materials including glass, ceramics, and organic high polymer materials such as epoxy resins, fluorine-containing resins, and the like, but is not limited to such particular materials. Generally, any transparent support that is usually used in solar cells can be successfully employed.

The transparent electrode employed in the present invention may be a transparent electrode formed in a thickness of about 200 A to 1 μm from such materials as ITO, $In_2O_3$, $SnO_2$, ITO/$SnO_2$, $Cd_xSnO_y$ (wherein x is 0.5 to 2 and y is 2 to 4) and $Ir_mO_n$ (wherein m is 0.1 to 0.99 and n=1−m). It should be understood that those materials are mentioned only by way of example and any of the materials which can serve as transparent electrodes for solar cells may be successfully employed.

The semiconductor layer employed in the present invention may be a semiconductive layer formed in a thickness of about 0.3 to 2 μm from semiconductor materials of amorphous or microcrystalline nature in the form of pin-type, pn-type, hetero-type, homo-type or Schottky barrier-type structure materials, which may be in multi-layer or stacked-up construction. It should be understood that the above materials are mentioned only by way of example and any of the semiconductive materials commonly used in solar cells may be successfully employed.

As examples of the back side electrode in the present invention, there may be employed electrodes formed in a thickness of about 300 Å to 2 μm from such materials as SUS, iron, aluminum, nickel, cadmium, brass, zinc, and silver, although the materials mentioned are nonrestrictive and any of the materials which are commonly used in solar cells can be successfully employed.

Figure 1:
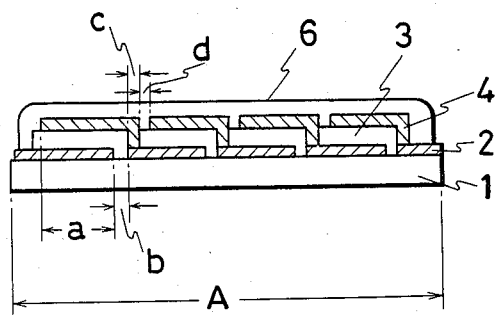
FIG. 1 is a schematic view showing in section an embodiment of the integrated solar cell according to the present invention.
Figure 3:
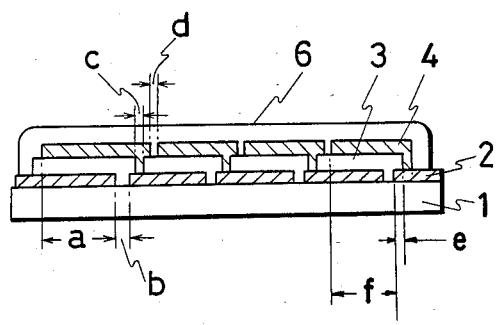
FIGS. 3 and 4 are schematic views illustrating in section different embodiments of the integrated solar cell according to the present invention.
Figure 4:
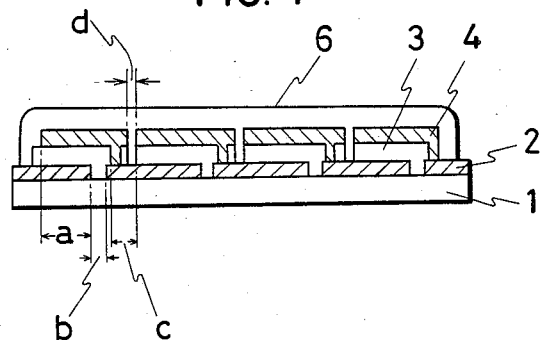

In accordance with the present invention, for example as illustrated in FIGS. 1, 3, and 4, a transparent electrode 2 may be disposed on an integral transparent support 1 in a pattern of about 2 to 20 parallel bands with a width of about 2 to 50 mm, a length of about 100 to 1000 mm and the space b between the adjacent electrode bands, or a plurality of repeating units of the same pattern may be formed on a single transparent support 1. It is possible, alternatively, to form the transparent electrode 2 by depositing a transparent electrode layer 10 over the entire surface of a single transparent support 1 and processing the transparent electrode layer into a pattern of parallel bands by wet-etching or dry-etching or by carbon dioxide or YAG laser scribing.

Subsequently, as shown in FIGS. 1 and 3, there is formed a semiconductor layer 3 on top of the transparent electrode in such a manner that each semiconductor band does not cover one of the long sides of the corresponding transparent electrode band but covers the other long side. It is possible, as an alternative procedure, to form a semiconductor layer over the entire surface of the transparent support 1 on which the pattern of the transparent electrode bands 2 have been formed, and processing the semiconductor layer into a pattern of bands in the same manner as in the above-mentioned formation of the transparent eletrode bands. Between the semiconductor bands thus formed, there is provided a space c. When the patterning is performed by means of a laser beam, the use of a silicon-containing amorphous or microcrystalline semiconductive material is preferred, in order that the patterning may be accomplished without damaging the transparent electrode.

Over the patterned transparent eletrode 2 and the patterned semiconductor layer 3 provided on the transparent support 1, there is superimposed, as shown in FIG. 1 or FIG. 3, a back side electrode 4 in such a pattern of bands that each of the bands does not cover one of the long sides of the corresponding semiconductor band (the side corresponding, to the uncovered long side of the transparent electrode band) but covers the other long side of the semiconductor band. As an alternative procedure, it is possible to form the back side electrode 4 by depositing a back side electrode layer over the entire surface of exposed parts of the patterned transparent electrode 2 and the patterned semiconductor layer 3, and then processing the back side electrode layer into a pattern of bands just as in the above-mentioned formation of the transparent electrode bands or the semiconductor bands. While there is a space d between the back side electrode bands 4, the back side electrode bands 4 must be in contact with the adjacent transparent electrode 2. In this embodiment, it is not necessary to connect solar cell elements with each other.

When patterning the transparent electrode layer 2, the semiconductor layer 3 or the back side electrode layer 4 which is pre-formed over the whole surface of the support by means of laser scribing with, for example, a YAG laser, the respective layers can be selectively scribed by decreasing the laser output stepwise.

Further, in the patterning of the back side electrode 4, the semiconductor layer 3 may be trimmed off to the same width as shown in FIG. 4. This procedure helps to reduce the amount of leak current and makes the solar cell especially suitable for low-illumination applications.

Figure 2:
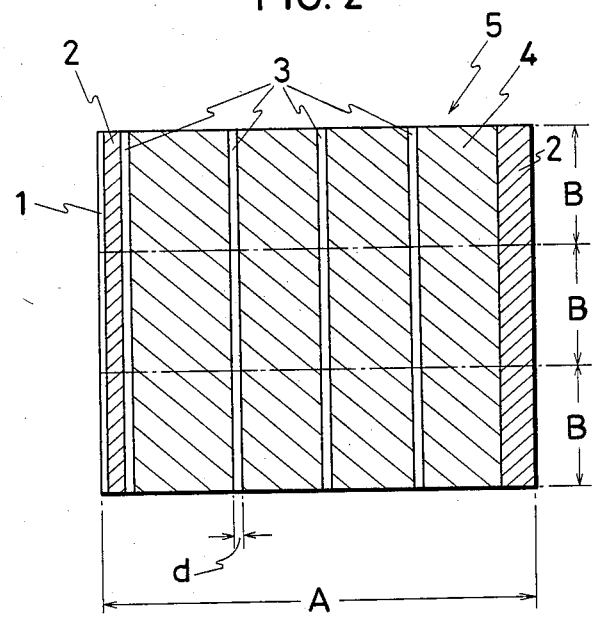
FIG. 2 is a schematic view showing an embodiment of the integrated solar cell blank used in the production of the integrated solar cell according to the present invention.

The resulting solar cell blank 5 having a sectional configuration shown in FIG. 1, 3, or 4 is cut at a lengthwise interval B as shown in FIG. 2 to provide a finished integrated solar cell according to the present invention. The integrated solar cell of cut-off construction may be covered with a protective layer 6 made of, for instance, a resin.

The solar cell blank 5 can be cut by an optional method which includes nonrestrictive cutting procedures such as cutting with a diamond cutter, shearing, or cutting with a carbon dioxide laser.

In the integrated solar cell according to the present invention, the relationship of $a \geq 10b$, $a \geq 10c$ and $a \geq 10d$ exists between the space a which is defined between one side of the transparent electrode band 2 and the opposite side of the back side electrode band 4, and the above-mentioned spaces b, c, and d as shown in FIG. 1 or FIG. 3. Moreover, the spaces b, c, and d are each preferably larger than 1 $\mu$m, more preferably not less than 10 $\mu$m. In the invention, since the spaces a, b, c and d satisfy the relationship of $a \geq 10b$, $a \geq 10c$, and $a \geq 10d$, a substantially large active area can be provided, so that a high output can be obtained as compared with the conventional solar cells. Further, when the spaces a, b, c, and d satisfy the relationship of $a \geq 100b$, $a \leq 100c$, and $a \leq 100d$, the series resistance at the contacts can be substantially disregarded so that the area efficiency can be improved without sacrificing the fill factor (FF). If the relationship is $a > 100b$, $a > 100c$ and $a > 100d$, the series resistance is too great to be disregarded any longer, so that the performance of the solar cell is not satisfactory.

In the integrated solar cell of the present invention, the relationship of the width A and the length B must be $B \geq A \geq 100B$. If the relationship of A and B is $A < B$, the leakage current at the contacts becomes so large that the solar cell is not satisfactory, particularly in a pocket calculator and other low illumination applications. In the case of $A > 100B$, the series resistance due to the transparent electrode cannot be disregarded, and thus the performance of the solar cell is sacrificed.

The best balanced construction is obtained when the relationship among a, b, c, d, A and B is $3B < A < 50B$, $a > 20b$, $a > 20c$, and $a > 20d$. In this construction, both the power generation efficiency and the area efficiency are very satisfactory. As shown in FIG. 3, the semiconductor layer 3 may extend over the adjacent transparent electrode band 2, or the back side electrode band 4 may extend over the adjacent semiconductor layer 3. In such cases, it is preferable to ensure that the overlap e of the semiconductor layer 3 and the adjacent transparent electrode 2, and the overlap f of the back side electrode band 4 and the adjacent semiconductor layer 3 should each be less than about 10 times as large as the spaces b, c, and d so that the current in the reverse direction may be held to a minimum and there will be no decrease in breakdown voltage.

On the other hand, as shown in FIG. 1 and FIG. 3, the semiconductor layer 3 need not necessarily be in contact with or overlapping the adjacent transparent electrode band 2, but it is necessary that the back side electrode band 4 be connected in series with the adjacent transparent electrode bands.

The values of A, B, a, b, c, and d may be virtually optional as long as they satisfy the relationships described above, and the generally preferred values are A=0.3 to 20 cm, B=0.1 to 20 cm, a=2 to 50 mm, b=0.01 to 5 mm, preferably 0.02 to 0.5 mm, c=0.01 to 5 mm, preferably 0.02 to 0.5 mm, and d=0.01 to 5 mm, preferably 0.01 to 0.5 mm.

According to the present invention, when the elongated integrated solar cell blank as shown in FIG. 2 having the sectional configuration shown in FIGS. 1, 3, or 4 is fabricated and cut to give the integrated solar cell, the percentage of the total area of solar cell elements with respect to the surface area of the transparent support can be increased to about 70 to 90 percent, with the result that the output per unit area can be as much increased. Moreover, by varying the cutting pitch, the output can be easily varied.

The present invention is more specifically described and explained by means of the following Example. It is to be understood that. the present invention is not limited to the Example and various changes and modifications may be made in the invention without departing from the spirit and scope thereof.

EXAMPLE 1

A transparent electrode layer of ITO of 1000 Å in thickness deposited on a glass sheet of 130 mm square was scribed with a YAG laser beam (6 W at CW, Q=13 KHz, 12,5 mm/sec) to form a pattern of ITO having 4 units of the A unit arranged in parallel at A=31 mm, a=7 mm and b=0.1 mm. After the ITO areas on both sides (FIG. 1) were masked, a semiconductor layer consisting of superimposed layers of 130 Å of p-type a-SiC:H, 6000 Å of intrinsic a-Si:H, and 300 Å of n-type $\mu$C-Si:H were deposited with a parallel flat type GD device (13.56 MHz, support temperature 200° C.). Then, the semiconductor layer alone was removed with a YAG laser beam so that the space c was 0.1 mm. After that, aluminum was vacuum-deposited in a thickness of about 1000 Å to form a back side electrode layer, and, in order that the space d is 0.1 mm, the aluminum was then removed with a YAG laser beam. The Al layer was coated with an epoxy resin and the whole construction was cut to the dimension B=12 mm to form the solar cell of the present invention.

The V-I characteristics of the solar cell as determined with a fluorescent lamp at 150 luxes were Isc=14 $\mu$A, Voc=2.3 V, and Iop at 1.5 V=12.5 $\mu$A.

When the above construction was cut to B=24 mm, the results were Isc=28 $\mu$A and Iop=25 $\mu$A. This clearly proved the fact that the output could be freely controlled by adjusting the dimension B.

What we claim is:

1. An integrated solar cell of cut-off construction, comprising
    a transparent support,
    a transparent electrode layer provided on said transparent support in the form of a plurality of elongated parallel bands,
    a semiconductor layer disposed on said transparent electrode layer in the form of a plurality of elongated parallel bands so that each of said semiconductor bands does not cover one of the long sides of the corresponding transparent electrode band but extends beyond the other long side over said transparent support or the adjacent transparent electrode, and
    a back side electrode disposed on said semiconductor layer in the form of a plurality of elongated parallel bands so that each of said back side electrode bands does not cover one of the long sides of the corresponding semiconductor band, which side corresponds to the uncovered side of said transparent electrode band, but extends beyond the other long side of said semiconductor band onto the adjacent transparent electrode band and may optionally extend onto the adjacent semiconductor band; wherein the relationship between the positions of said transparent electrode, said semiconductor layer, and said back side electrode are as follows:

a>20b, a>20c, and a>20d in which a is the space between the covered long side of said transparent electrode band and the opposite long side of said back side electrode band disposed through said semiconductor layer on said transparent electrode, b is the space between the covered long side of said transparent electrode band and the other long side of the adjacent transparent electrode band, c is the space between the covered long side of said semiconductor band and the other long side of the adjacent semiconductor band, and d is the space between the long side of the back side electrode band on the last mentioned covered side and the other long side of the adjacent back side electrode band; and said solar cell is obtained by cutting the above construction in the widthwise direction of said transparent electrode bands with an interval B so as to satisfy the relationship of 3B<A<50B wherein A is the overall length of said integrated solar cell.

2. The integrated solar cell of claim 1, wherein the relationship between the spaces a, b, c, and d is a≦100b, a≦100c, and a≦100d.

3. The integrated solar cell of claim 1, wherein said transparent electrode has a thickness of 200 Å to 1 $\mu$m, said semiconductor layer has a thickness of 0.3 to 2 $\mu$m and said back side electrode has a thickness of 300 Å to 2 $\mu$m.

* * * * *